(12) United States Patent
Daubenspeck et al.

(10) Patent No.: US 8,933,540 B2
(45) Date of Patent: Jan. 13, 2015

(54) THERMAL VIA FOR 3D INTEGRATED CIRCUITS STRUCTURES

(71) Applicant: International Business Machines Corporation, Armonk, NY (US)

(72) Inventors: Timothy H. Daubenspeck, Colchester, VT (US); Jeffrey P. Gambino, Westford, VT (US); Michael J. Hauser, Bolton, VT (US); Christopher D. Muzzy, Burlington, VT (US); Wolfgang Sauter, Richmond, VT (US); Timothy D. Sullivan, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/780,033

(22) Filed: Feb. 28, 2013

(65) Prior Publication Data
US 2014/0239457 A1 Aug. 28, 2014

(51) Int. Cl.
*H01L 23/34* (2006.01)
*H01L 25/00* (2006.01)

(52) U.S. Cl.
CPC ................ *H01L 23/34* (2013.01); *H01L 25/50* (2013.01)
USPC .......................................... 257/621; 257/777

(58) Field of Classification Search
USPC ...................... 257/686, 777, 774, 713, 621
See application file for complete search history.

(56) References Cited

U.S. PATENT DOCUMENTS

| 5,579,207 A | 11/1996 | Hayden et al. |
| 5,811,790 A | 9/1998 | Endo et al. |

(Continued)

OTHER PUBLICATIONS

Shekhar Borkar, "3D Integration Technology for Energy Efficient System Design", 978-1-4244-5065-7/10, © 2010 IEEE, pp. 100-103.

(Continued)

*Primary Examiner* — Whitney T Moore
(74) *Attorney, Agent, or Firm* — L. Jeffrey Kelly; Anthony J. Canale

(57) ABSTRACT

A three dimensional integrated circuit (3D-IC) structure, method of manufacturing the same and design structure thereof are provided. The 3D-IC structure includes two chips having a dielectric layer, through substrate vias (TSVs) and pads formed on the dielectric layer. The dielectric layer is formed on a bottom surface of each chip. Pads are electrically connected to the corresponding TSVs. The chips are disposed vertically adjacent to each other. The bottom surface of a second chip faces the bottom surface of a first chip. The pads of the first chip are electrically connected to the pads of the second chip through a plurality of conductive bumps. The 3D-IC structure further includes a thermal via structure vertically disposed between the first chip and the second chip and laterally disposed between the corresponding conductive bumps. The thermal via structure has an upper portion and a lower portion.

9 Claims, 13 Drawing Sheets

(56) References Cited

U.S. PATENT DOCUMENTS

| | | | |
|---|---|---|---|
| 6,720,662 | B1 | 4/2004 | Den |
| 6,891,447 | B2 | 5/2005 | Song |
| 6,977,440 | B2 | 12/2005 | Pflughaupt et al. |
| 7,495,326 | B2 | 2/2009 | Rinne |
| 7,511,380 | B2 | 3/2009 | Yamazaki et al. |
| 7,656,030 | B2 | 2/2010 | Osone et al. |
| 7,838,988 | B1 | 11/2010 | Gurrum et al. |
| 8,174,098 | B2 | 5/2012 | Tay et al. |
| 8,298,930 | B2 | 10/2012 | Arvin et al. |
| 2006/0006517 | A1 | 1/2006 | Lee et al. |
| 2009/0008795 | A1 | 1/2009 | Honer et al. |
| 2010/0065953 | A1* | 3/2010 | Egawa ................ 257/686 |
| 2010/0203655 | A1* | 8/2010 | Ayotte et al. ............ 438/17 |
| 2013/0292846 | A1* | 11/2013 | Lee et al. ............. 257/774 |

OTHER PUBLICATIONS

Haehyung Lee et al., Thermal Characterization of High Performance MCP with Silicon Spacer Having Low Thermal Impedance, 21st IEEE Semi-Therm Symposium, 0-7803-8985-9/05 © 2005 IEEE.

Calvin R. King, Jr., et al., "3D Stacking of Chips with Electrical and Microfluidic I/O Interconnects", 2008 Electronic Components and Technology Conference, 978-1-4244-2231-9/08, © 2008 IEEE, pp. 1-7.

Ankur Jain et al., "Thermal Modeling and Design of 3D Integrated Circuits", 978-1-4244-1701-8/08 © 2008 IEEE, pp. 1139-1145.

* cited by examiner

THERMAL VIA FOR 3D INTEGRATED CIRCUITS STRUCTURES

BACKGROUND

Field of the Invention

The present invention relates to 3 dimensional integrated circuits (3D-ICs) in which at least two IC chips are stacked.

Many methods have been suggested in semiconductor manufacturing technology to form 3D-ICs. 3D-IC technology typically demands very thin chips of tens of μm to achieve high density integration. The thin chips are stacked and electrically connected by through substrate vias (TSVs).

Conventional 3D-ICs may have a problem with heat that may be trapped between the stacked chips during the operation of the chips. Such heat trapping may result in a temperature rise of the devices and an unwanted failure. Consequently, chip product characteristics, for example, refresh characteristics, operating speed, and life time, may deteriorate.

A number of approaches have been proposed to improve cooling in 3D-ICs including microfluidic cooling and silicon spacer cooling. However, these approaches are relatively expensive. Accordingly, it is desirable to provide a lower cost alternative structure and method of forming die stacks that can effectively transfer and dissipate heat trapped between chips in 3D-ICs.

SUMMARY

In an aspect of the invention, a 3D-IC structure comprises a first chip having a first dielectric layer, a plurality of TSVs and a plurality of pads formed on the first dielectric layer. The first dielectric layer is formed on a bottom surface of the first chip. Pads are electrically connected to the corresponding TSVs of the first chip. The 3D-IC structure further comprises a second chip having a second dielectric layer, a plurality of TSVs and a plurality of pads formed on the second dielectric layer. The second dielectric layer is formed on a bottom surface of the second chip. Pads are electrically connected to the corresponding TSVs of the second chip. The second chip is disposed vertically adjacent to the first chip. The bottom surface of the second chip faces the bottom surface of the first chip. The pads of the first chip are electrically connected to the pads of the second chip through a plurality of conductive bumps. The 3D-IC structure further comprises a thermal via structure vertically disposed between the first chip and the second chip and laterally disposed between the corresponding conductive bumps. An upper portion of the thermal via is formed in the first dielectric layer and contacts the bottom surface of the first chip. A lower portion of the thermal via is formed in the second dielectric layer and contacts the bottom surface of the second chip.

In yet another aspect of the invention, a method for fabricating a 3D-IC structure comprises forming a first dielectric layer on a bottom surface of a first chip having a first plurality of TSVs. The method further comprises forming a second dielectric layer on a bottom surface of a second chip having a second plurality of TSVs. The method further comprises selectively removing portions of the first and second dielectric layers to define a thermal via region. The method further comprises forming a plurality of first pads and first barrier layer metallurgy (BLM) plate. The first pads are respectively electrically connected to the corresponding TSVs of the first chip. The first BLM plate is formed within the thermal via region. The method further comprises forming a plurality of second pads and second BLM plate. The second pads are electrically connected to the corresponding TSVs of the second chip. The second BLM plate is formed within the thermal via region. The method further comprises forming a solder material on the plurality of second pads and on the second BLM plate within the thermal via region. The method further comprises bonding the first chip to the second chip. The solder material within the thermal via region is vertically separated from the first BLM plate by an air gap region.

A more complete understanding of the present invention, as well as further features and advantages of the present invention, will be obtained by reference to the following detailed description and drawings. It is to be understood that both the foregoing general description and the following detailed description are exemplary and explanatory only, and should not be considered restrictive of the scope of the invention, as described and claimed. Further, features or variations may be provided in addition to those set forth herein. For example, embodiments of the invention may be directed to various combinations and sub-combinations of the features described in the detailed description.

BRIEF DESCRIPTION OF THE SEVERAL VIEWS OF THE DRAWINGS

The present invention is described in the detailed description which follows in reference to the noted plurality of drawings by way of non-limiting examples of exemplary embodiments of the present invention.

DETAILED DESCRIPTION

An embodiment of the present invention relates to a structure and method of forming 3D-ICs. More specifically, an embodiment of the present invention comprises a 3D-IC structure which includes a first chip having a first dielectric layer, a plurality of TSVs and a plurality of pads formed on the first dielectric layer. The first dielectric layer is formed on a bottom surface of the first chip. Pads are electrically connected to the corresponding TSVs of the first chip. The 3D-IC structure further comprises a second chip having a second dielectric layer, a plurality of TSVs and a plurality of pads formed on the second dielectric layer. The second dielectric layer is formed on a bottom surface of the second chip. Pads are electrically connected to the corresponding TSVs of the second chip. The second chip is disposed vertically adjacent to the first chip. The bottom surface of the second chip faces the bottom surface of the first chip. The pads of the first chip are electrically connected to the pads of the second chip through a plurality of conductive bumps. The 3D-IC structure further comprises a thermal via structure vertically disposed between the first chip and the second chip and laterally disposed between the corresponding conductive bumps. An upper portion of the thermal via is formed in the first dielectric layer and contacts the bottom surface of the first chip. A lower portion of the thermal via is formed in the second dielectric layer and contacts the bottom surface of the second chip. Advantageously, the 3D-IC structure of disclosed embodiment of the present invention is an improvement over prior art as it uses barrier layer metallurgy (BLM) for solder bumps to provide the thermal via structure, thus eliminating one or more process steps and thereby reducing the fabrication cost. Various disclosed embodiments of the present invention also relate to 3D-IC structures having thermal vias separated from a corresponding substrate by a barrier layer.

Figure 1A:
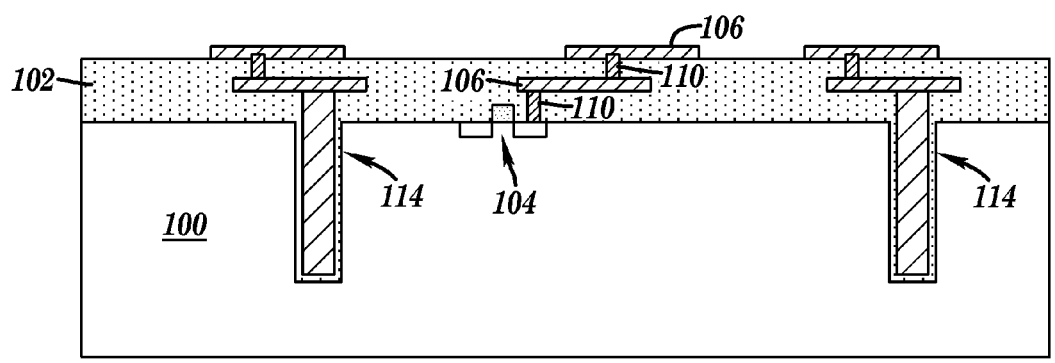
FIGS. 1A through 1G schematically illustrate conventional method steps for fabrication of a 3D-IC structure.
Figure 1B:
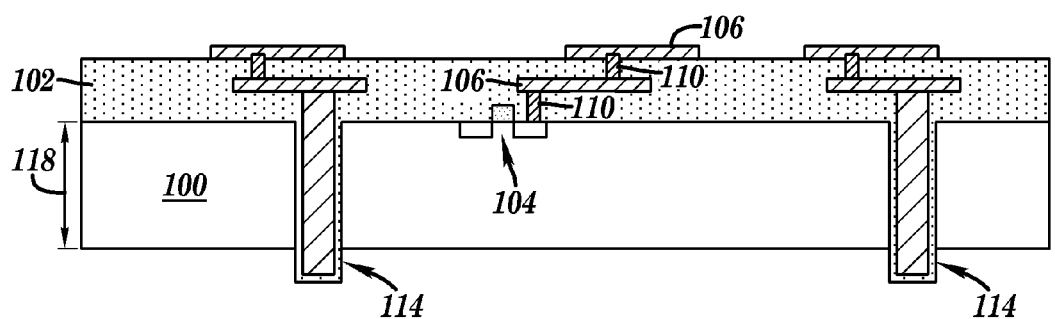
Figure 1C:
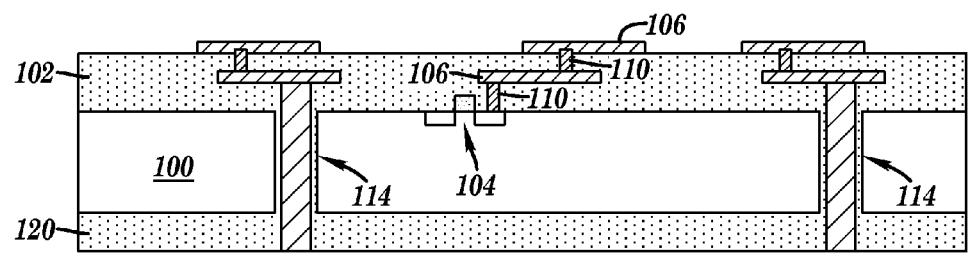
Figure 1D:
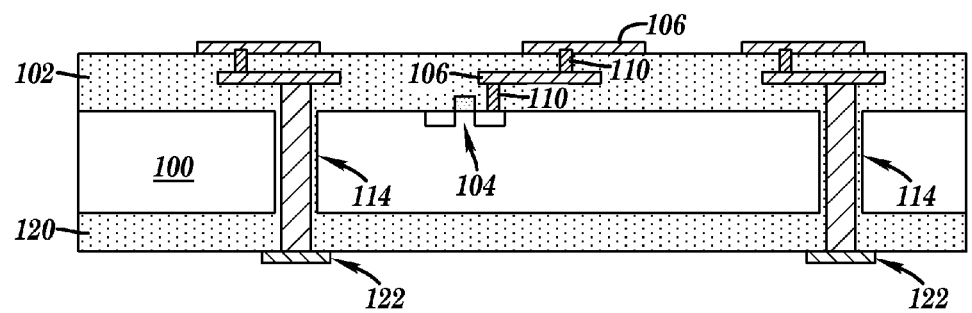
Figure 1E:
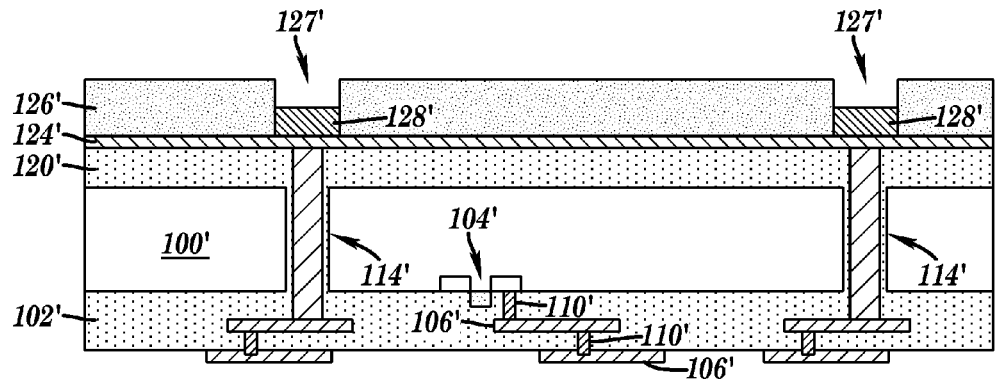
Figure 1F:
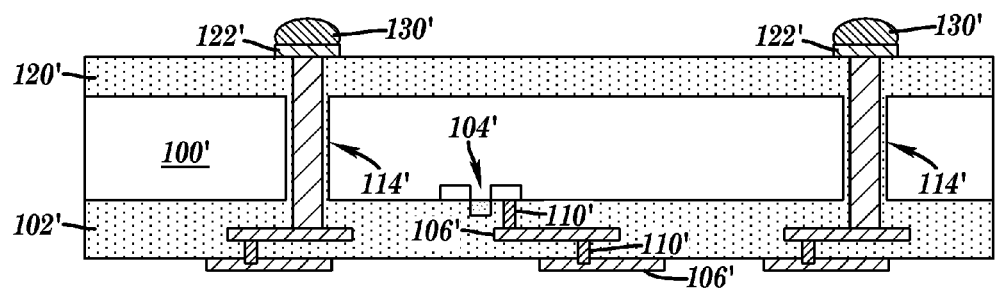
Figure 1G:
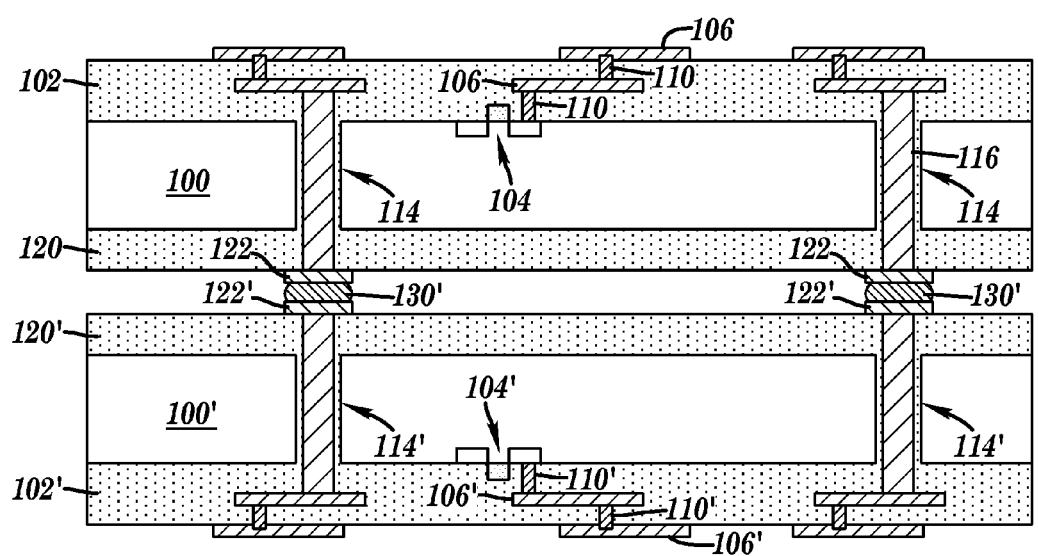

FIGS. 1A through 1F schematically illustrate method steps for fabrication of a conventional structure shown in FIG. 1G. One method of providing electrical connection between adjoining semiconductor chips in a 3D-IC structure is "flip chip" technology in which an array of solder bumps are employed between two adjoined semiconductor chips that are vertically stacked back to back. Referring to FIG. 1A, a vertical cross-sectional view of a prior art semiconductor chip (hereinafter referred to as a first chip) shows a semiconductor substrate and a metal interconnect structure formed thereon. The semiconductor substrate includes semiconductor layer 100 comprising a semiconductor material. Semiconductor device regions 104 including various semiconductor devices are formed in upper portions of semiconductor substrate 100 by method known in the art.

The various semiconductor devices in semiconductor device regions 104 are electrically connected within the semiconductor chip employing contacts and vias 110 and line-level metal wiring structures 106 that are formed within back-end-of-line (BEOL) dielectric layer 102 formed directly on semiconductor substrate 100.

Electrical connection between line-level metal wiring structures 106 and the bottom surface of semiconductor substrate 100 is provided by through substrate vias (TSVs) 114. Each of TSVs 114 are formed substantially through the entire thickness of semiconductor substrate 100, hence the name "though substrate vias." To form TSVs 114, a lower portion of BEOL dielectric layer 102 is deposited on semiconductor substrate 100, followed by patterning TSV trenches in the lower portion of BEOL dielectric layer 102 and semiconductor substrate 100. TSV trenches 114 may extend from a bottom surface of line-level metal wiring structures 106 and terminate in the body of semiconductor substrate 100 at depth of approximately 5 microns to 200 microns from the top surface of semiconductor substrate 100 but above the chip backside, as shown in FIG. 1A. TSV trenches 114 may have inner sidewalls and inner bottom surface covered with a conformal dielectric liner, such as $SiO_2$ or $Si_3N_4$. Subsequently, TSV trenches 114 are filled with a conductive material, such as copper or tungsten, and with appropriate refractory metal barrier layers. Copper is preferred for TSVs 114 due to its high conductivity.

Referring to FIG. 1B, following TSV 114 formation, the first chip is transferred, for example, to a commercial wafer grinding tool to expose TSVs 114 by mechanical thinning. Mechanical thinning may include, for example, the following three steps: coarse grinding, fine grinding, and final polish. Once TSVs 114 are polished, wet etching or dry etching may be employed to remove the last portion of semiconductor substrate 100, so as to leave TSVs 114 extend from approximately 1 µm to approximately 10 µm below the bottom surface of semiconductor substrate 100, as shown in FIG. 1B. As a result of thinning, thickness 118 of semiconductor substrate 100 may range, for example, from approximately 5 microns to approximately 200 microns.

With the backside thinning completed, first backside dielectric layer 120, such as a silicon oxide, is deposited and polished, thereby completing the formation of TSVs 114, as shown in FIG. 1C. BEOL dielectric layer and first dielectric layer 120 may be deposited by chemical vapor deposition ("CVD"), plasma enhanced CVD ("PECVD") and/or other suitable methods.

As depicted in FIG. 1D, the BLM (barrier layer metallurgy) may be employed to form bond pads 122 on the bottom surface of first dielectric layer 120 of the first chip. Bond pads 122 may be formed using standard semiconductor fabrication processes and materials. For example, bond pads 122 may comprise a first layer composed of TiW (titanium-tungsten) that is deposited (e.g. via physical vapor deposition (PVD) sputtering) on the exposed surface of first dielectric layer 120. Bond pads 122 also may include a second layer comprising, for example, Cu (copper) formed on the first layer by electroplating. Any desired etching process, some of which are described below, may be employed to remove portions of the first and second BLM layers in order to form bond pads 122 depicted in FIG. 1D.

Referring to FIG. 1E, a vertical cross-sectional view of a second chip included in the 3D-IC structure is shown. The second chip includes semiconductor layer 100' comprising a semiconductor material. Semiconductor device regions 104' including various semiconductor devices are formed in semiconductor substrate 100' by method known in the art.

The various semiconductor devices in semiconductor device regions 104' are electrically connected within the second semiconductor chip employing substrate level contact vias 110' and line-level metal wiring structures 106' that are formed within a back-end-of-line (BEOL), referred to hereinafter as second BEOL dielectric layer 102' formed directly on semiconductor substrate 100'.

Electrical connection between line-level metal wiring structures 106' and the bottom surface of semiconductor substrate 100' is provided by through substrate vias (TSVs) 114' formed in accordance with processes described above in relation to the first chip.

Since the described process involves vertically stacking adjoined semiconductor chips back to back, FIG. 1E depicts the second chip rotated, so that inactive surface is a top surface. As shown in FIG. 1E, once second dielectric layer 120' and BLM layer 124' comprising, for example, a first layer of TiW (titanium-tungsten) and a second layer of copper (Cu) are formed at the inactive surface of the second chip, layer of photoresist material 126' may be formed on BLM layer 124', developed, and exposed to define opening 127' where a solder bump will be formed. Opening 127' is aligned with TSV 114'. As depicted in FIG. 1E, a solder bump comprising solder material 128' is formed in opening 127' defined by photoresist material 126'.

As depicted in FIG. 1F, photoresist material 126' may be stripped from BLM layer 124'. Removal of photoresist material 126' exposes portions of BLM layer 124' on the second chip. Accordingly, as depicted in FIG. 1F, BLM layers 124' are etched to the edge of solder material 128'. BLM layer 124' may be etched using any desired etch process. As shown in FIG. 1F, solder material 128' may be reflowed to form solder ball 130'.

After solder balls 130' are formed on the second chip they are carefully aligned with corresponding bond pads 122 on the first chip. Subsequently, the first and second chips are moved together and flip-chip bonded. Solder balls 130' may be reflowed by heating, in order to form welded joints. As a result, a 3D-IC structure is formed as shown in FIG. 1G. The 3D-IC structure shown in FIG. 1G includes two chips vertically stacked and electrically connected by TSVs 114 and 114' through solder balls 130' vertically disposed between corresponding contact pads 122 and 122'.

However, the conventional 3D-IC structure depicted in FIG. 1G may have a problem with heat that may be trapped between the stacked chips during the operation of the chips. Such heat trapping may result in a temperature rise of the devices and an unwanted failure. Consequently, chip product characteristics, for example, refresh characteristics, operating speed, and life time, may deteriorate.

Figure 2A:
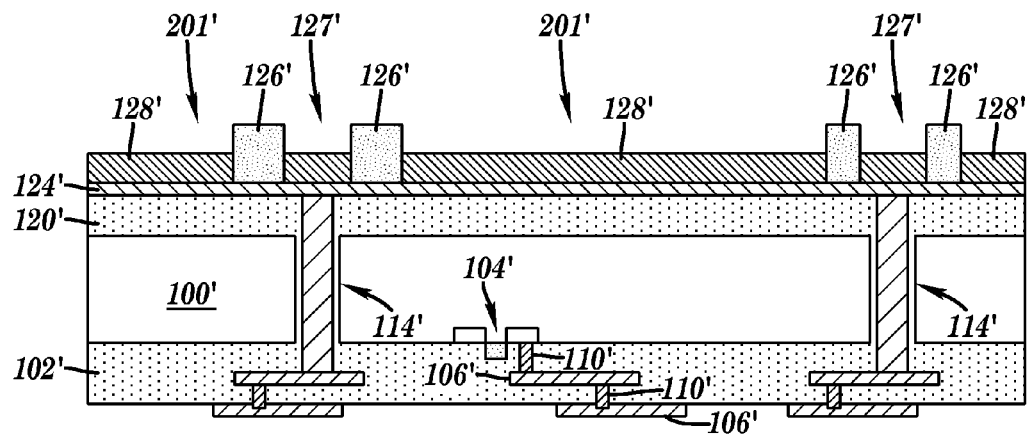
FIGS. 2A through 2C schematically illustrate method steps for fabrication of a 3D-IC structure having a heat sink in accordance with an embodiment of the present invention.
Figure 2B:
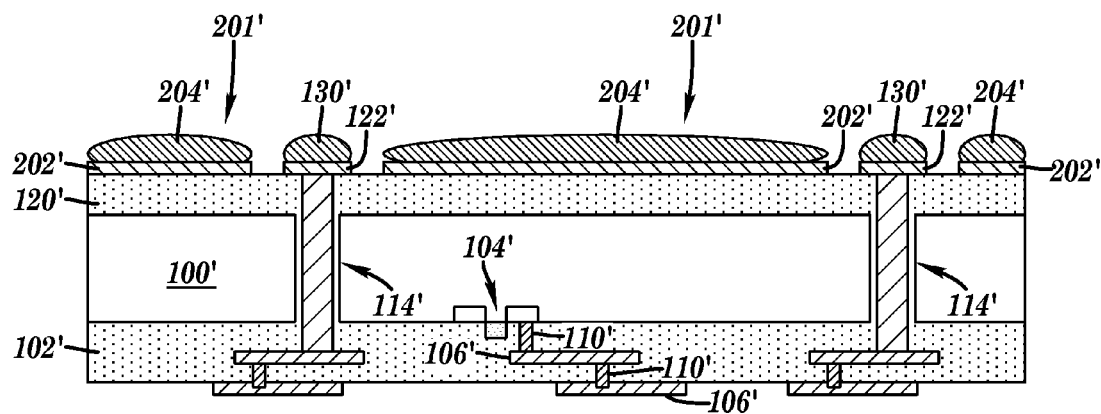
Figure 2C:
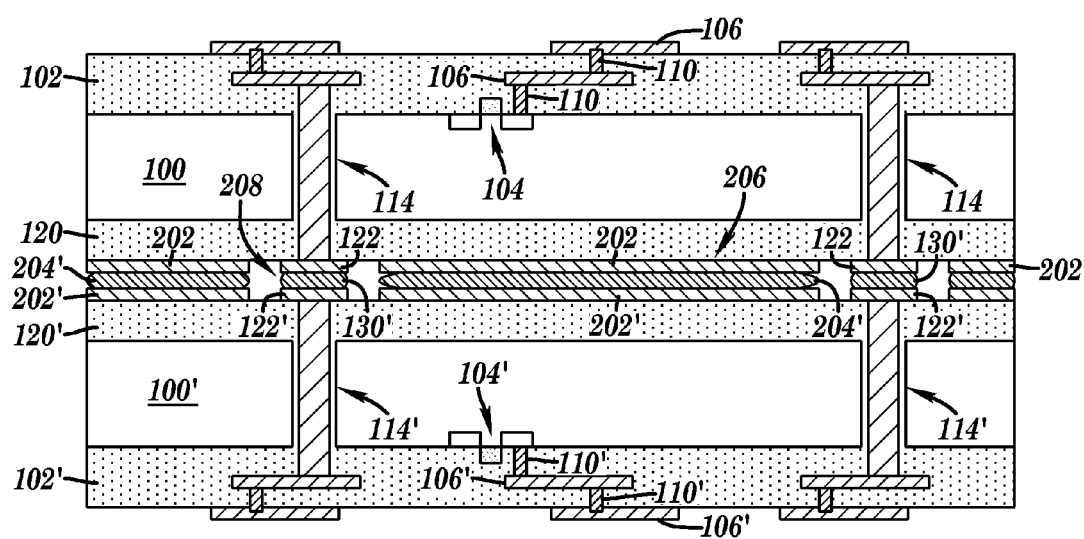

FIGS. 2A through 2C schematically illustrate method steps for fabrication of a 3D-IC structure having a heat sink in accordance with an embodiment of the present invention. As described above with reference to FIG. 1E, once second dielectric layer 120' and BLM layer 124', comprising, for example, layers of TiW and Cu, are formed at the inactive (backside) surface of the second chip, layer of photoresist material 126' may be formed on BLM layer 124'. However, according to this illustrative embodiment, the developed and exposed photoresist mask 126' in addition to defining openings 127' where a solder bump will be formed also defines openings 201' where a heat sink will be formed. As depicted in FIG. 2A, solder material 128' is formed in the openings 127' and 201' defined by photoresist material 126'. Solder material 128' may be formed using conventional techniques, such as electroplating. Solder material 128' may comprise any suitable material(s), such as Pb-free (e.g., Sn-based) solder.

As depicted in FIG. 2B, photoresist material 126' may be stripped from BLM layer 124' using any suitable conventional techniques, such as an HF stripping process. Removal of photoresist material 126' exposes portions of BLM layer 124' on the second chip. Accordingly, as depicted in FIG. 2B, BLM layer 124' may be etched to the edge of solder material 128'. BLM layer 124' may be etched using any desired etch process. For example, a two step etch may be employed that includes an electroetching process to remove portions of the second layer (Cu) and a wet etch process (e.g., an H$_2$O based wet etch) to remove portions of the first layer (e.g., TiW). The BLM etching forms bonding pads 122' under edges of solder material 128'. In addition, in accordance with an embodiment of the present invention, the BLM etching also forms a portion of the heat sink comprising a BLM plate 202' (referred to hereinafter as a second BLM plate) overlying and contacting second dielectric layer 120' of the second chip. As shown in FIG. 2B, second BLM plate 202' is laterally separated from the corresponding bonding pads 122' by a gap in order to prevent an electrically conductive connection between bonding pads 122'. Subsequently, as shown in FIG. 2B, solder material 128' may be reflowed to form solder balls 130' and to form solder plate 204' overlying second BLM plate 202' in the heat sink region of the second chip. Similarly, the BLM etching process described above may be employed to form corresponding bond pads 122 and first BLM plate 202 underlying and contacting first dielectric layer 120 of the first chip.

After solder balls 130' and solder plates 204' are formed on the second chip and first BLM plate 202 is formed on the first chip, bond pads 122' and solder plates 204' of the second chip may be carefully aligned with the corresponding bond pads 122 and first BLM plates 202 of the first chip. Subsequently, the first and second chips may be moved together and flip-chip bonded. Solder balls 130' and solder plates 204' may be reflowed by heating, in order to form welded joints. As a result, a 3D-IC structure having a heat sink structure is formed in accordance with an embodiment of the present invention, as shown in FIG. 2C. The 3D-IC structure shown in FIG. 2C includes two chips vertically stacked and electrically connected by TSVs 114 and 114' through solder balls 130' vertically disposed between corresponding contact pads 122 and 122'. The multichip 3D-IC structure further comprises a heat sink structure 206 vertically disposed between the first chip and the second chip and laterally disposed between the corresponding conductive bumps. As an example, heat sink structure 206 may have a thickness from approximately 70 µm to approximately 90 µm. Solder plate 204' of the heat sink structure may have a thickness from approximately 55 µm to approximately 65 µm. Note that the total thickness of the heatsink depends on the BLM thickness and the solder thickness, and can range from 5 microns to 200 microns. Heat sink structure 206 shown in FIG. 2C creates a heat dissipating path to effectively transfer heat generated in the chips, particularly, heat trapped between the chips. Advantageously, the 3D-IC structure of disclosed embodiment of the present invention is an improvement over prior art as it uses BLM for solder bumps to provide the heat sink structure, thus eliminating one or more process steps and thereby reducing the fabrication cost.

Figure 3A:
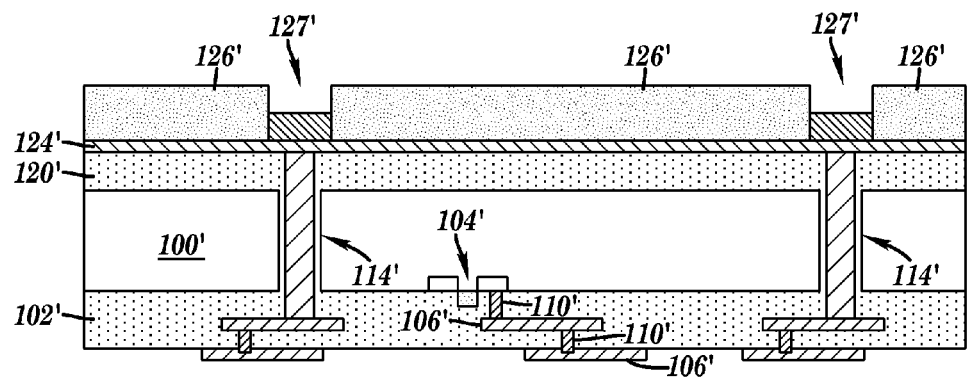
FIGS. 3A through 3C schematically illustrate method steps for fabrication of a 3D-IC structure having a heat sink in accordance with another embodiment of the present invention.
Figure 3B:
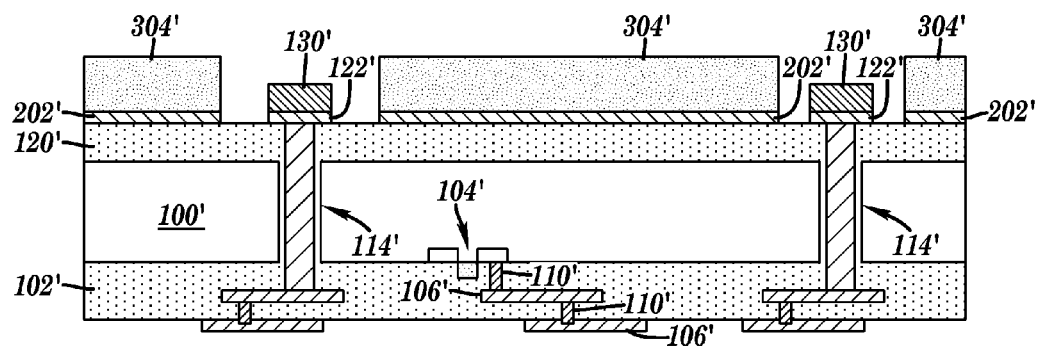
Figure 3C:
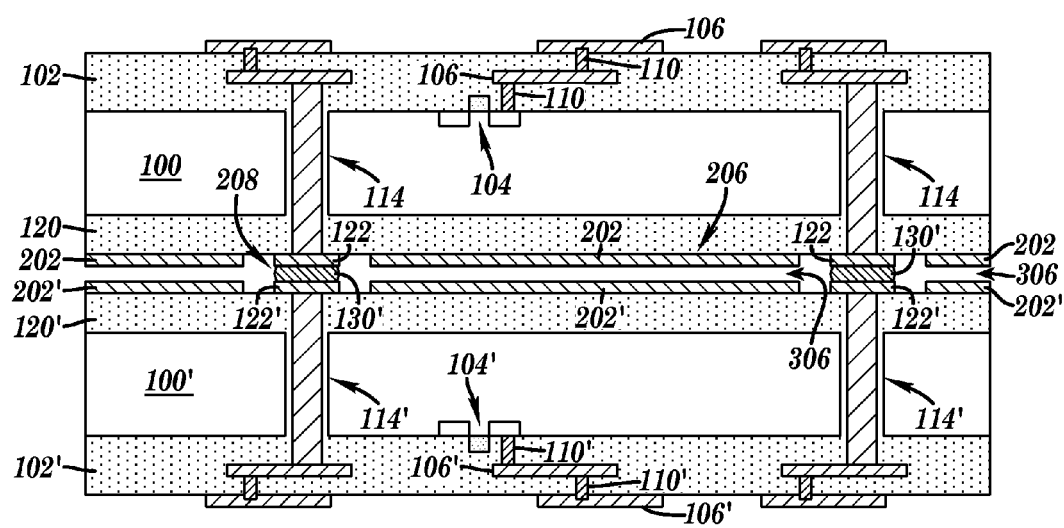

FIGS. 3A through 3C schematically illustrate method steps for fabrication of a 3D-IC structure having a heat sink in accordance with another embodiment of the present invention. This embodiment employs additional masking step described below.

FIG. 3A depicts once again how a layer of photoresist material 126' may be formed on BLM layer 124' of the second chip. However, in contrast to previously described embodiment, the developed and exposed photoresist mask 126' only defines openings 127' where a solder bump will be formed. As depicted in FIG. 3A, solder material is formed in openings 127' defined by photoresist material 126'. Solder material may be formed using conventional techniques, such as electroplating.

Next, photoresist material 126' may be stripped from BLM layer 124' using any suitable conventional techniques, such as an organic solvent stripping process. Removal of photoresist material 126' exposes entire upper surface of BLM layer 124' with the exception of the narrow portions of the BLM layer 124' underlying the solder material. Accordingly, prior to etching, as depicted in FIG. 3B, another layer of photoresist material 304' may be formed on BLM layer 124' of the second chip. This time photoresist mask 304' may be formed to define the heat sink region of the structure. Next, BLM layer 124' is etched to the edge of photoresist material 304' using any desired etch process, including etch processes described above. Thus, the BLM etching effectively forms contacts pads 122' underlying the solder material 130' and the etching further forms second BLM plate 202'. Process steps shown in FIGS. 3A and 3B may be applied to BLM layer 124 of the first chip to form corresponding bond pads 122 and first BLM plate 202.

Referring now to FIG. 3C, there is shown a cross-sectional view of a 3D-IC structure formed after flip-chip bonding of the first and second chips. The heat sink structure 206 shown in FIG. 3C includes first BLM plate 202, second BLM plate 202' and an air gap region 306 vertically extending between first BLM plate 202 and second BLM plate 202'.

Figure 3D:
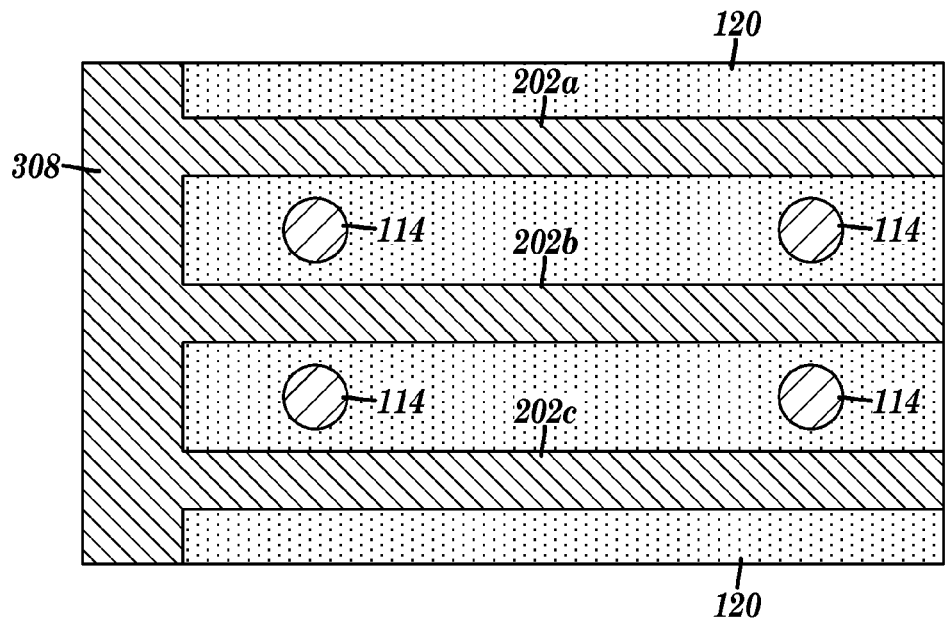
FIGS. 3D and 3E are cross-sectional views of the heat sink structure of FIGS. 2C and 3C in accordance with embodiments of the present invention.
Figure 3E:
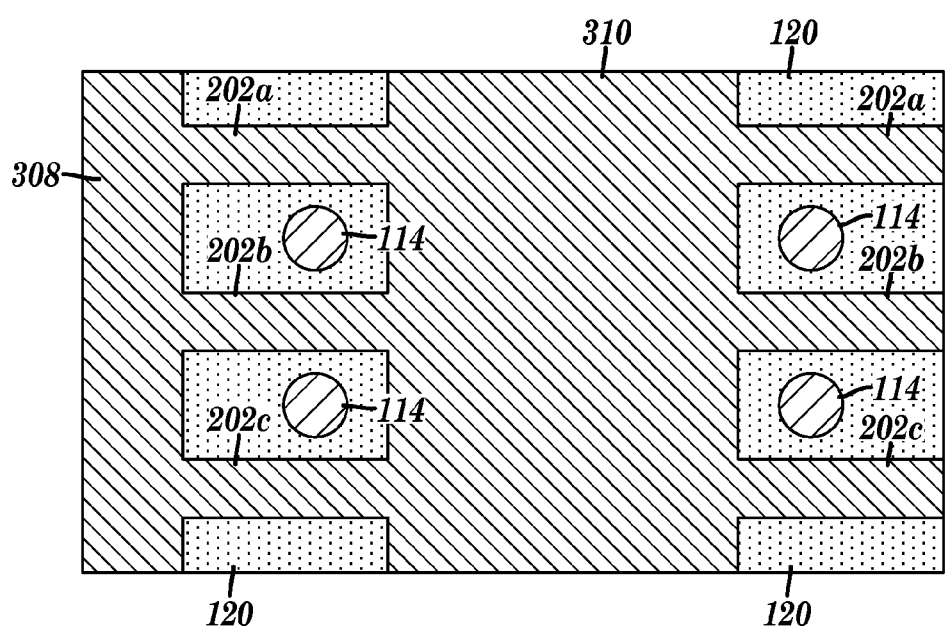

FIGS. 3D and 3E are top-down views of the portion of heat sink structure 206 of FIGS. 2C and 3C in accordance with embodiments of the present invention. FIGS. 3D and 3E provide two exemplary options for patterning heat sink structure 206 of FIGS. 2C and 3C. Referring to FIG. 3D first, according to an embodiment of the present invention, a plurality of BLM plates 202a-c may form a grid-like structure. For instance, BLM plates 202a-c may be formed as a plurality of heat transferring strips arranged substantially parallel to each other and substantially parallel to a plurality of TSVs 114 formed within the semiconductor substrate portion of each chip. For simplicity and clarity of illustration only four TSVs 114 and only three BLM plates 202a-c are shown in FIG. 3D. However, such illustration is not a limitation or requirement. The number, size and arrangement of BLM plates 202a-c are dependent on any number of factors. As shown in FIG. 3D, the grid-like heat sink structure may also include an interconnecting portion 308 extending along at least one edge of the chip and connecting the plurality of BLM plates 202a-c. Advantageously, each of BLM plates 202 a-c may be employed as a heat dissipating path to transfer heat from a center of the 3D-IC structure depicted in FIG. 3C towards at least one of the outer edge portions (i.e. interconnecting portion 308). It should be noted that heat sink portion of the structure may have substantially equivalent patterns on both chips comprising the 3D-IC.

FIG. 3E depicts an alternative arrangement of heat sink structure 206 of FIGS. 2C and 3C in accordance with yet another embodiment of the present invention. As shown in FIG. 3E, in addition to having a plurality of BLM plates 202 a-c and interconnecting portion 308, the grid-like structure may also include at least one more portion 310 that may be arranged substantially orthogonal to the plurality of BLM plates 202 a-c.

Figure 4A:
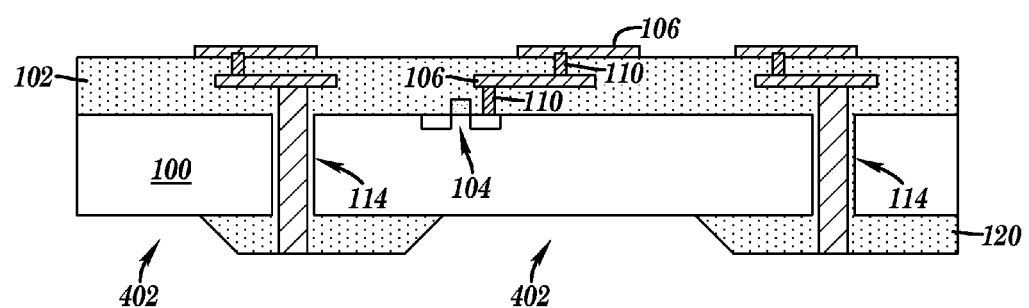
FIGS. 4A through 4C schematically illustrate method steps for fabrication of a 3D-IC structure having a thermal via in accordance with an embodiment of the present invention.
Figure 4B:
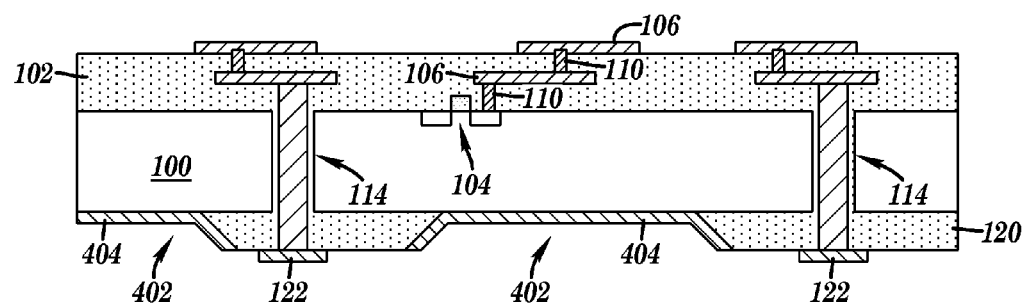
Figure 4C:
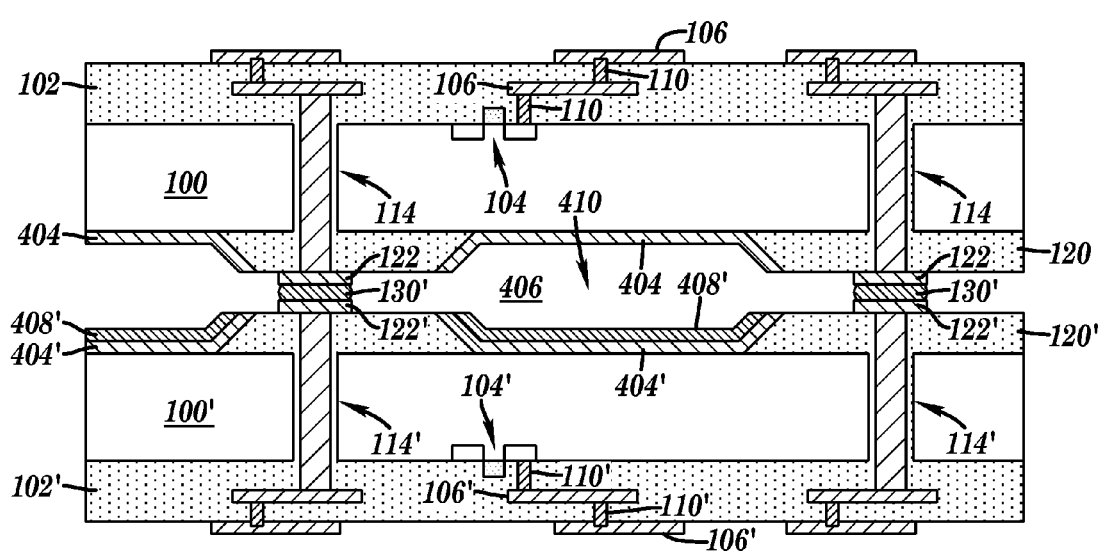

FIGS. 4A through 4C schematically illustrate method steps for fabrication of a 3D-IC structure having a thermal via, in accordance with an embodiment of the present invention. According to this exemplary embodiment, the thermal conductivity in a 3D-IC structure may be accomplished by forming a plurality of thermal vias within the structure. In FIGS. 4A through 4C, elements and/or process steps which are structurally or functionally equivalent to corresponding elements and/or process steps described above will be given the same reference numerals and, for sake of brevity, will not be further described.

FIG. 4A illustrates a cross-sectional view of the first chip after formation and polishing of first dielectric layer 120 (as described above in reference with FIG. 1C). In FIG. 4A first dielectric layer 120 may then be patterned and etched to form openings 402 between TSVs 114 within first dielectric layer 120. Such a patterning process may include wet and/or dry etching employing photolithographic processes.

In an embodiment of the present invention first dielectric layer 120 may be etched by a profile controlled method to form recessed sidewalls. FIG. 4A shows openings 402 having sidewalls that are inclined inward as a result, for example, of increasing the oxygen ratio of the etch.

FIG. 4B illustrates next step of employing the BLM to form bond pads 122 and first BLM plate 404 of a thermal via on the bottom surface of first dielectric layer 120 of the first chip. Bond pads 122 and first BLM plate 404 may be formed using standard semiconductor fabrication processes and materials described above. For example, bond pads 122 and first BLM plate 404 may comprise a first layer composed of TiW that is deposited (e.g. via PVD sputtering) on the exposed surface of first dielectric layer 120 and conformally covering inner walls of the etched-away openings 402. It should be noted that first BLM plate 404 contacts the exposed part of semiconductor substrate 100. Bond pads 122 and first BLM plate 404 may also include a second layer comprising, for example, Cu formed on the first layer by electroplating. Any desired etching process, some of which are described above, may be employed to remove portions of the first and second BLM layers in order to form bond pads 122 and first BLM plate 404, as depicted in FIG. 4B.

Next, functionally equivalent process steps may be performed on the second chip to form corresponding bond pads 122' and second BLM plate 404' (shown in FIG. 4C) of the second chip. In addition, according to this illustrative embodiment, a photoresist mask, such as photoresist mask 126' shown in FIG. 2A, may be used to form solder bumps 130' on the corresponding bond pads 122' as well as solder plate 408' on second BLM plate 404'. Solder plate 408' may be formed using conventional techniques, such as electroplating.

Referring now to FIG. 4C, there is shown a cross-sectional view of a 3D-IC structure formed after flip-chip bonding of the first (shown in FIGS. 4A and 4B) and second chips. Thermal via structure 406 shown in FIG. 4C includes first BLM plate 404, formed under and contacting a portion of semiconductor substrate 100 of the first chip. Thermal via structure 406 further includes second BLM plate 404' formed over and contacting a portion of semiconductor substrate 100' of the second chip. According to an illustrative embodiment, second BLM plate 404' of thermal via structure 406 may be covered by solder plate 408'. As shown in FIG. 4C, thermal via structure 406 may further include air gap region 410 vertically extending between first BLM plate 404 and solder plate 408'. Advantageously, thermal via 406 provides thermal conductivity to transfer heat from a center of the multi-chip package structure depicted in FIG. 4C towards at least one of the outer edge portions.

Figure 5A:
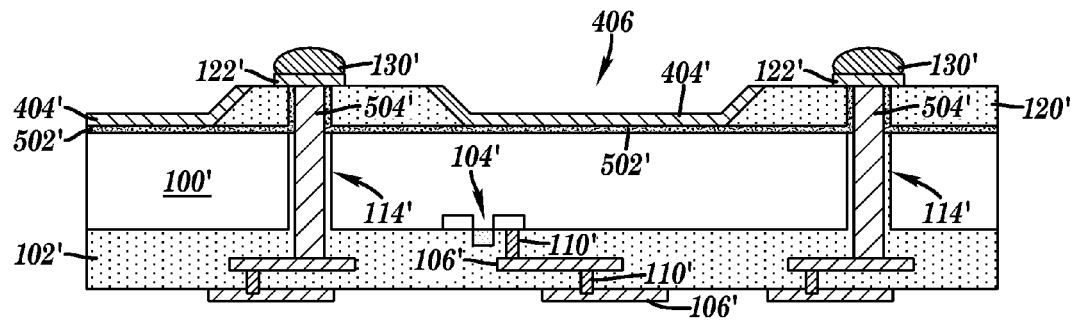
FIG. 5A schematically illustrates method steps for fabrication of a 3D-IC structure having a thermal via in accordance with another embodiment of the present invention.

FIG. 5A schematically illustrates method steps for fabrication of a 3D-IC structure having a thermal via in accordance with another embodiment of the present invention. At least in some embodiments described above, first BLM plate 404 and second BLM plate 404' may include copper. However, copper is very mobile and can diffuse quickly through certain materials. Electromigration of copper into semiconductor substrate 100 may ruin device 104 performance. Thus, it may be preferable both chips to have barrier layers in place to avoid any diffusion into semiconductor substrates 100 and 100'.

Referring to FIG. 5A, after the backside thinning is completed thus exposing TSVs 114' of the second chip (as described above in reference with FIG. 2B), second barrier layer 502' may be formed, for example, by CVD. In an embodiment of the present invention, second barrier layer 502' may comprise at least one material selected from the group consisting of, for example, but not limited to $SiO_2$, SiC, SiN, and the like. Second barrier layer 502' may have a thickness ranging from approximately 5 nm to approximately 100 nm. Second barrier layer 502' may be formed directly on semiconductor substrate 100' and may also cover protruding portions 504' of TSVs 114'. As depicted in FIG. 5A, after second barrier layer 502' is formed, the steps of depositing second dielectric layer 120', polishing second dielectric layer 120' and second barrier layer 502' to expose TSVs 114', forming second BLM plate 404', deposition and patterning of a first resist layer (not shown), plating solder material and stripping the first resist layer may be performed as described above in reference with FIG. 1E. Another layer of photoresist material (not shown) may be formed on second BLM plate 404' of the second chip to define thermal via region 406 of the structure. Next, BLM layer 404' may be etched using any desired etch process, including etch processes described above. Thus, the BLM etching effectively forms contacts pads 122' underlying solder bumps 130' and the BLM etching further forms second BLM plate 404' on the second chip. Process steps shown in FIG. 5A may be also performed on the first chip to form corresponding first barrier layer, bond pads 122 and first BLM plate 404. In accordance with an embodiment of the present invention, after flip-chip bonding of the first and second chips, the resultant 3D-IC structure may be formed having a thermal via. Such structure differs from the structure shown in FIG. 4C by providing barrier layer 502' interposed between semiconductor substrate 100' and second dielectric layer 120' of the second chip. It should be noted, as depicted in FIG. 5A, within thermal via region 406, second barrier layer 502' may be interposed between semiconductor substrate 100' and second BLM plate 404' of the second chip. While FIG. 5A does not depict the first chip, it would be apparent to a person of ordinary skills in the art that that after rotation the first chip will have a mirror image configuration of the structure shown in FIG. 5A. Such mirror image structure would include the first barrier layer.

Figure 5B:
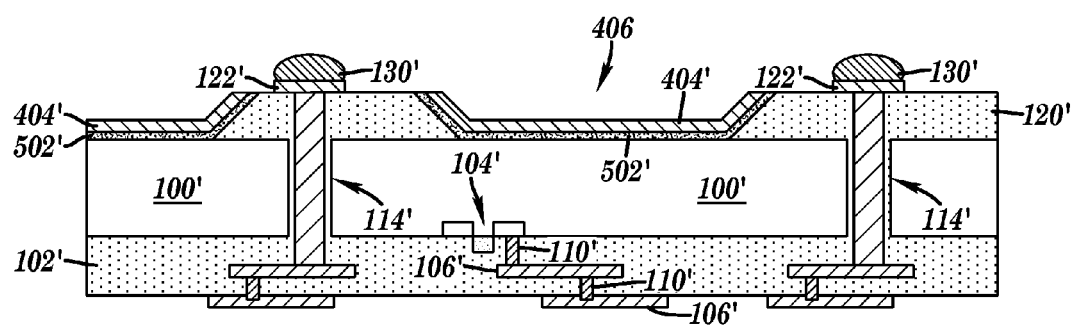
FIG. 5B schematically illustrates method steps for fabrication of a 3D-IC structure having a thermal via in accordance with yet another embodiment of the present invention.

FIG. 5B schematically illustrates method steps for fabrication of a 3D-IC structure having a thermal via in accordance with yet another embodiment of the present invention. FIG. 5B depicts an alternative embodiment of the second chip structure depicted in FIG. 5A. According to this alternative embodiment, second barrier layer 502' may be formed only within thermal via region 406. Unlike the process shown in and described with reference to FIG. 5A, a coating of second barrier layer 502' may be deposited and polished after thermal via region 406 is formed by etching away corresponding portions of second dielectric layer 120' of the second chip. As previously indicated, second barrier layer 502' may be formed within thermal via region 406 in order to prevent metal diffusion from second BLM plate 404' into semiconductor substrate 100'. It should be noted that according to this embodiment, a corresponding first barrier layer may also separate first BLM plate 404 from semiconductor substrate 100 of the first chip within thermal via region 406.

Thus, as described above, the 3D-IC structures of disclosed embodiments of the present invention are an improvement over prior art as they use BLM to facilitate effective transfer and dissipation of heat trapped between chips in the 3D-ICs.

Figure 6:
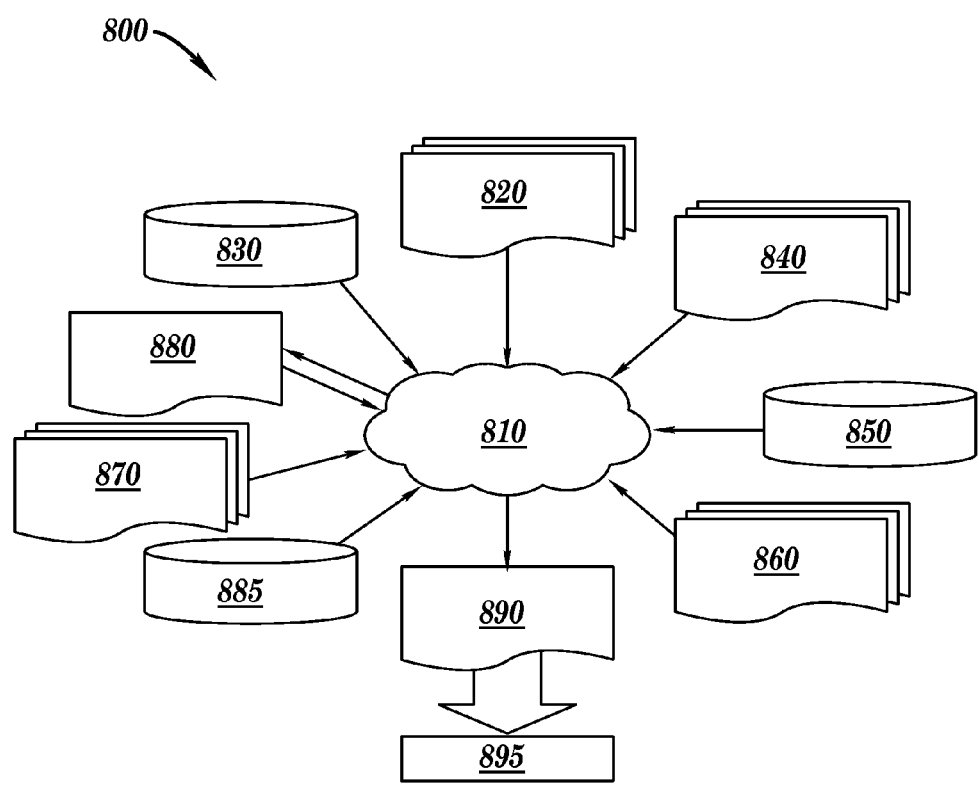
FIG. 6 is a flow diagram of a design process used in semiconductor design, manufacture, and/or test.

FIG. 6 shows a block diagram of an exemplary design flow 800 used for example, in semiconductor IC logic design, simulation, test, layout, and manufacture. Design flow 800 includes processes, machines and/or mechanisms for processing design structures or devices to generate logically or otherwise functionally equivalent representations of the design structures and/or devices described above and shown in FIGS. 2A-5C. The design structures processed and/or generated by design flow 800 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g., e-beam writers), computers or equipment for simulating design structures, any apparatus used in the manufacturing or test process, or any machines for programming functionally equivalent representations of the design structures into any medium (e.g., a machine for programming a programmable gate array).

Design flow 800 may vary depending on the type of representation being designed. For example, a design flow 800 for building an application specific IC (ASIC) may differ from a design flow 800 for designing a standard component or from a design flow 800 for instantiating the design into a programmable array, for example a programmable gate array (PGA) or a field programmable gate array (FPGA) offered by Altera® Inc. or Xilinx® Inc.

FIG. 6 illustrates multiple such design structures including an input design structure 820 that is preferably processed by a design process 810. Design structure 820 may be a logical simulation design structure generated and processed by design process 810 to produce a logically equivalent functional representation of a hardware device. Design structure 820 may also or alternatively comprise data and/or program instructions that when processed by design process 810, generate a functional representation of the physical structure of a hardware device. Whether representing functional and/or structural design features, design structure 820 may be generated using electronic computer-aided design (ECAD) such as implemented by a core developer/designer. When encoded on a machine-readable data transmission, gate array, or storage medium, design structure 820 may be accessed and processed by one or more hardware and/or software modules within design process 810 to simulate or otherwise functionally represent an electronic component, circuit, electronic or logic module, apparatus, device, or system such as those shown in FIGS. 2A-5C. As such, design structure 820 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 810 preferably employs and incorporates hardware and/or software modules for synthesizing, translating, or otherwise processing a design/simulation functional equivalent of the components, circuits, devices, or logic structures shown in FIGS. 2A-5C to generate a netlist 880 which may contain design structures such as design structure 820. Netlist 880 may comprise, for example, compiled or otherwise processed data structures representing a list of wires, discrete components, logic gates, control circuits, I/O devices, models, etc. that describes the connections to other elements and circuits in an integrated circuit design. Netlist 880 may be synthesized using an iterative process in which netlist 880 is resynthesized one or more times depending on design specifications and parameters for the device. As with other design structure types described herein, netlist 880 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 810 may include hardware and software modules for processing a variety of input data structure types including netlist 880. Such data structure types may reside, for example, within library elements 830 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 840, characterization data 850, verification data 860, design rules 870, and test data files 885 which may include input test patterns, output test results, and other testing information. Design process 810 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 810 without deviating from the scope and spirit of the invention. Design process 810 may also include modules for performing standard circuit design processes such as timing analysis, verification, design rule checking, place and route operations, etc.

Design process 810 employs and incorporates logic and physical design tools such as HDL compilers and simulation model build tools to process design structure 820 together with some or all of the depicted supporting data structures along with any additional mechanical design or data (if applicable), to generate a second design structure 890. Design structure 890 resides on a storage medium or programmable gate array in a data format used for the exchange of data of mechanical devices and structures (e.g., information stored in a IGES, DXF, Parasolid XT, JT, DRG, or any other suitable format for storing or rendering such mechanical design structures). Similar to design structure 820, design structure 890 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 2A-5C. In an embodiment, design structure 890 may comprise a compiled, executable HDL simulation model that functionally simulates the devices shown in FIGS. 2A-5C.

Design structure 890 may also employ a data format used for the exchange of layout data of integrated circuits and/or symbolic data format (e.g., information stored in a GDSII (GDS2), GL1, OASIS, map files, or any other suitable format for storing such design data structures). Design structure 890 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 2A-5C. Design structure 890 may then proceed to a stage 895 where, for example, design structure 890 proceeds to tape-out, is released to manufacturing, is released to a mask house, is sent to another design house, is sent back to the customer, etc.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A three dimensional (3D) integrated circuit structure comprising:
   a first chip having a first dielectric layer, a first plurality of through substrate vias (TSVs) and a first plurality of pads on the first dielectric layer, the first dielectric layer formed on a bottom surface of the first chip, the pads are electrically connected to the corresponding TSVs of the first chip;
   a second chip having a second dielectric layer, a second plurality of TSVs, and a second plurality of pads on the second dielectric layer, the second dielectric layer formed on a bottom surface of the second chip, the pads are electrically connected to the corresponding TSVs of the second chip, the second chip disposed vertically adjacent to the first chip, wherein the bottom surface of the second chip faces the bottom surface of the first chip and wherein the pads of the first chip are electrically connected to the pads of the second chip through a plurality of conductive bumps;
   a thermal via structure vertically disposed between the first chip and the second chip and laterally disposed between the corresponding conductive bumps, the thermal via structure having an upper portion and a lower portion, the upper portion formed in the first dielectric layer and contacting the bottom surface of the first chip and the lower portion formed in the second dielectric layer and contacting the bottom surface of the second chip, wherein the upper portion of the thermal via structure comprises a first barrier layer and a first BLM plate and the lower portion of the thermal via comprises a second barrier layer and a second BLM plate.

2. The 3D integrated circuit structure of claim 1, wherein the upper portion of the thermal via structure is vertically separated from the lower portion by an air gap region.

3. The 3D integrated circuit structure of claim 1, wherein the upper portion of the thermal via structure comprises a first barrier layer metallurgy (BLM) plate and the lower portion of the thermal via comprises a second BLM plate and a layer of a solder material formed over the second BLM plate.

4. The 3D integrated circuit structure of claim 1, wherein the upper portion of the thermal via structure comprises a first BLM plate and the lower portion of the thermal via comprises a second BLM plate.

5. The 3D integrated circuit structure of claim 4, wherein opposing sidewalls of the first and second BLM plates are inclined inwardly towards each other.

6. The 3D integrated circuit structure of claim 4, wherein the first and second BLM plates comprise at least one copper-containing layer.

7. The 3D integrated circuit structure of claim 4, wherein the first and second BLM plates comprise at least one TiW layer.

8. The 3D integrated circuit structure of claim 1, wherein the first chip has a first barrier layer disposed between the bottom surface of the first chip and the first dielectric layer and wherein the second chip has a second barrier layer disposed between the bottom surface of the second chip and the second dielectric layer.

9. The 3D integrated circuit structure of claim 1, wherein a thickness of the first and second barrier layers ranges from approximately 5 nm to approximately 100 nm.

* * * * *